United States Patent
Chang et al.

(10) Patent No.: US 8,907,372 B2
(45) Date of Patent: Dec. 9, 2014

(54) THYRISTOR AND METHOD FOR THE SAME

(71) Applicant: Lite-On Semiconductor Corp., New Taipei (TW)

(72) Inventors: Pen-Te Chang, Keelung (TW); Wen-Chung Liu, Keelung (TW)

(73) Assignee: Lite-On Semiconductor Corp., New Taipei (TW)

( * ) Notice: Subject to any disclaimer, the term of this patent is extended or adjusted under 35 U.S.C. 154(b) by 3 days.

(21) Appl. No.: 13/655,545

(22) Filed: Oct. 19, 2012

(65) Prior Publication Data

US 2014/0110751 A1  Apr. 24, 2014

(51) Int. Cl.
*H01L 29/74* (2006.01)
*H01L 21/332* (2006.01)

(52) U.S. Cl.
USPC .... 257/107; 257/115; 257/157; 257/E29.211; 257/E21.388; 438/137

(58) Field of Classification Search
CPC ...... H01L 21/332; H01L 29/74; H01L 31/111
USPC .......... 257/107, 115, 157, E31.071, E27.052, 257/E27.079, E29.036–E29.038, E29.046, 257/E29.048, E29.115, E29.125, E29.196, 257/E29.211, E29.224, E29.225, E29.337, 257/E29.211, E29.224, E29.225, E29.337, 257/E21.35, E21.388, E21.389, E21.392
See application file for complete search history.

(56) References Cited

U.S. PATENT DOCUMENTS

| | | | | | |
|---|---|---|---|---|---|
| 4,821,083 | A | * | 4/1989 | Ogura et al. | 257/130 |
| 5,040,042 | A | * | 8/1991 | Bauer et al. | 257/124 |
| 5,629,535 | A | * | 5/1997 | Ajit | 257/120 |

* cited by examiner

*Primary Examiner* — Fernando L Toledo
*Assistant Examiner* — Lawrence-Linh T Nguyen
(74) *Attorney, Agent, or Firm* — Li & Cai Intellectual Property (USA) Office

(57) ABSTRACT

A thyristor includes a base region, a pair of first doping regions, at least one second doping region, at least one third doping region, and a pair of metal layers. The first doping regions are formed in two opposite sides of the base region and touch the base region. The second doping region is formed between the base region and one of the first doping regions. The second doping region touches the base region and the first doping region. The third doping region is formed in one of the first doping regions and touches the first doping region. The type of the first doping region is different from the types of the second doping region, the third doping region, and the base region. The metal layers touch the first doping regions respectively. The first doping regions and the third doping region are located between the metal layers.

10 Claims, 5 Drawing Sheets

THYRISTOR AND METHOD FOR THE SAME

BACKGROUND

1. Technical Field

The invention relates to a semiconductor device, and in particular, to a thyristor and its manufacturing method.

2. Description of Related Art

The thyristor is a semiconductor device used to protect the circuitry and might prevent the electronic components of the circuitry from interference or damage of the unexpected voltage surges. The voltage surges, for example, might be caused by the electrostatic discharge, lightning induction and induced voltage. Therefore, nowadays, thyristors are used in many electronic devices, like modems, universal serial buses (USBs), asymmetric digital subscriber lines (ADSLs), routers and set-top boxes, (STBs) and so on.

Some of electronic devices, such as the ADSL, the router, and the STB, have higher voltage sensitivity so that this kind of electronic devices are easily interfered and damaged by the voltage surges with a voltage value that is not relatively high. Thus, the thyristor which is utilized to protect this kind of electronic device usually need a lower breakdown voltage to avoid the interference or damage from the voltage surges.

The breakdown voltage of the thyristor is usually determined by the doping concentration of the base region. In general, the higher the doping concentration of the base region is, the lower the breakdown voltage of the thyristor is. In contrast, the lower the doping concentration of the base region is, the higher the breakdown voltage of the thyristor is. Therefore, the thyristors utilized in the above-mentioned electronic devices are made of the silicon substrate with a high doping concentration, so that the base region of this kind of thyristor usually has the higher doping concentration.

SUMMARY

The present invention provides a thyristor which has a lower breakdown voltage.

The present invention provides a method for manufacturing the above-mentioned thyristor.

The present invention provides a thyristor which includes a base region, a pair of first doping regions, at least a second doping region, at least a third doping region, and a pair of metal layers. The base region has a first side and a second side opposite to the first side. The pair of first doping regions are formed on the first side and the second side of the base region respectively and are in contact with the base region. The second doping region is formed between one of the first doping regions and the base region, and is in contact with the base region and the first doping region. The third doping region is formed inside one of the first doping regions and is in contact with the first doping region. Third doping region is not in contact with the base region. The doping type of the first doping region is different from the doping type of the second doping region, the third doping region, and the base region. The pair of the metal layers is in contact with these first doping regions. These first doping regions and the third doping region are located between these metal layers. One of the metal layers is further in contact with the third doping region.

The present invention provides a manufacturing method of the thyristor. First, a substrate is provided with a first doping type. The substrate has a first surface and a pair of second surfaces opposite to the first surface. Next, the first surface and the second surface are doped to form a pair of first doping regions, at least a second doping region, and a base region located between these first doping regions. The base region is in contact with these first doping regions, and the second doping region is formed between one of the first doping regions and the base region. The second doping region is in contact with the base region and the first doping region. The doping type of the first doping region is a second doping type which is different from the first doping type, and the doping type of the second doping region is the first doping type. After that, these first doping regions are doped to form at least a third doping region. The third doping region has the first doping type and is not in contact with the base region. Then, a pair of metal layers is formed on these first doping regions respectively. These metal layers are in contact with these first doping regions respectively, and one of the metal layers is further in contact with the third doping region.

To sum up, the above-mentioned second doping region may be utilized to generate the inner electric field between the second doping region and the first doping region, so that the thyristor in the present invention may have a lower breakdown voltage.

In order to further appreciate the characteristic and technical contents of the present invention, references are hereunder made to the detailed descriptions and appended drawings in connection with the present invention. However, the appended drawings are merely shown for exemplary purpose rather than being used to restrict the scope of the present invention.

BRIEF DESCRIPTION OF THE DRAWINGS

The accompanying drawings are included to provide a further understanding of the present disclosure, and are incorporated in and constitute a part of this specification. The drawings illustrate exemplary embodiments of the present disclosure and, together with the description, serve to explain the principles of the present disclosure.

DESCRIPTION OF THE EXEMPLARY EMBODIMENTS

Figure 1A:
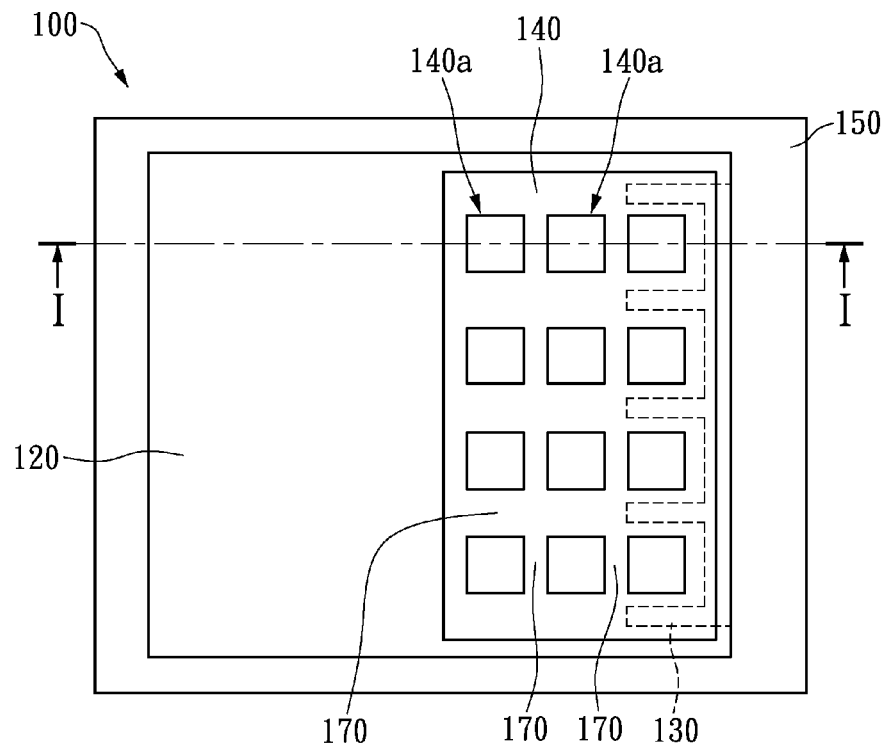
FIG. 1A is a plan view of the thyristor in the first embodiment of the present invention.
Figure 1B:
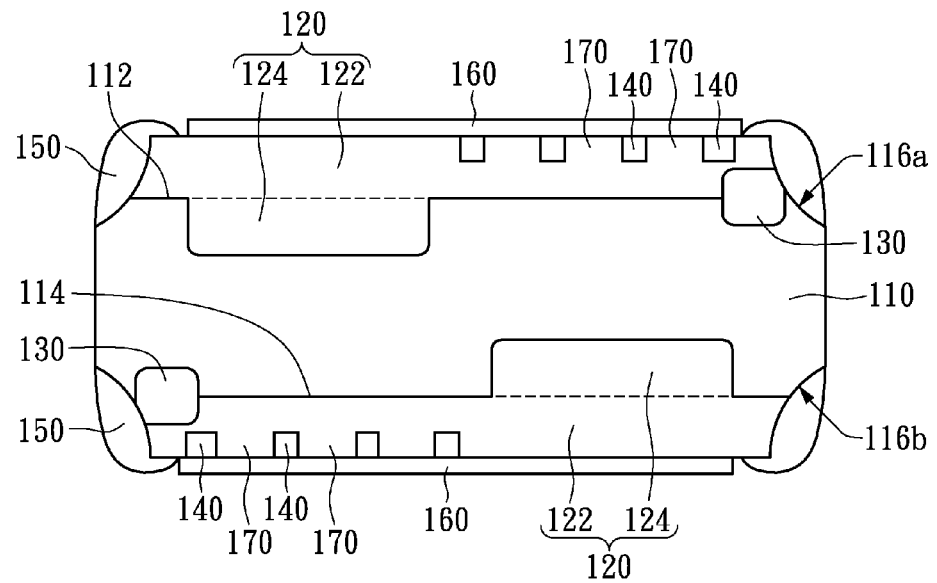
FIG. 1B is a cross-sectional view of the thyristor in FIG. 1A.

FIG. 1A is the plan view of the thyristor in the first embodiment of the present invention, and FIG. 1B is the cross-sectional view of the line I-I in FIG. 1A. Referring to FIGS. 1A and 1B, the thyristor 100 includes a base region 110, a pair of first doping regions 120, a pair of second doping regions 130, and a pair of third doping regions 140. The base region 110 includes a first side 112, a second side 114, and a pair of concave side surfaces 116a, 116b. The first side 112 is opposite to the second side 114. The concave side surface 116a surrounds and connects to the first side 112, and the concave side surface 116b surrounds and connects to the second side 114.

This pair of first doping regions 120 is formed on the first side 112 and the second side 114 of the base region 110 respectively, and the doping concentration of each first doping region 120 might be non-uniform. Specifically, each first doping region 120 might include a heavy doping region 122 and a light doping region 124. The doping concentration of the heavy doping regions 122 is higher than the doping concentration of the light doping regions 124 significantly, so that the doping concentration inside the first doping regions 120 might be non-uniform.

Continued from the preceding paragraph, the heavy doping regions 122 are in contact with the base region 110, the second doping regions 130, and the light doping regions 124. Each light doping region 124 is located between one of the heavy doping regions 122 and the base region 110. Those light doping regions 124 are form on the first side 112 and the second side 114 of the base region 110 respectively, and are in contact with the base region 110 and those heavy doping regions 122.

Those third doping regions 140 are formed in the first doping regions 120 respectively, and are in contact with those first doping regions 120. Those third doping regions 140 are formed in the heavy doping regions 122 of the first doping regions 120, and are in contact with those heavy doping regions 122 respectively. However, those third doping regions 140 are not in contact with the base region 110 and the light doping regions 124.

The third doping region 140 is in the shape of a mesh and has a plurality of mesh spaces 140a and short circuit regions 170. Those mesh spaces 140a are arranged in an array, and each short circuit region 170 is located between two of the adjacent mesh spaces 140a. In other words, each short circuit region 170 is the region between two of the adjacent mesh spaces 140a within one of the third doping regions 140, and each of the mesh spaces 140a in FIG. 1A might be surrounded by four adjacent short circuit regions 170.

Each second doping region 130 is formed between one of the first doping regions 120 and the base region 110. Each second doping region 130 is in contact with the base region 110 and one of the first doping regions 120. Those second doping regions 130 are in contact with the heavy doping regions 122, but not in contact with the light doping regions 124. The second doping region 130 is in the shape of the comb, besides, one of the second doping regions 130 extends from the concave side surface 116a to the adjacent third doping region 140 and partially exposes on the concave side surface 116a. The other second doping region 130 extends from the concave side surface 116b to the adjacent third doping region 140 and partially exposes on the concave side surface 116b. Furthermore, those second doping regions 130 might not overlap any one of the mesh spaces 140a.

The doping type of the first doping regions 120 is different from the doping type of the second doping regions 130, the third doping regions 140 and the base region 110. For instance, in this embodiment, the doping type of the first doping regions 120 might be P-type, and the doping type of the second doping regions 130, the third doping regions 140, and the base region 110 might be N-type. Nevertheless, in other embodiment, the doping type of the first doping regions 120 might be N-type, and the doping type of the second doping regions 130, the third doping regions 140, and the base region 110 might be P-type.

Besides, the doping concentration of the second doping regions 130 is higher than the doping concentration of the base region 110, and lower than the doping concentration of the third doping regions 140. In other words, among the above-mentioned three doping regions with the same doping type, the sequence of the doping concentration from low to high is the base region 110, the second doping region 130, and the third doping region 140. Moreover, the whole doping concentration of the thyristor 100 might be between 1E13 ion/cm2 and 1E15 ion/cm2.

The thyristor 100 further includes a pair of metal layers 160 which is in contact with and cover those first doping regions 120 and the third doping regions 140 respectively. All the first doping regions 120 and the third doping regions 140 are located between this pair of the metal layers 160. Therefore, those metal layers 160 are located on two opposite outsides of the thyristor 100 respectively. In addition, those metal layers 160 is made of Al, Cu, Al—Cu alloy or other conductive material.

Continued from the preceding paragraph, the function of those metal layers 160 is to be the electrode of the thyristor 100, such as the anode and the cathode, thus those metal layers 160 might be in contact with outer circuit, such as the metal wire or the trace of the circuit board, so as to transmit the voltage from the metal layers 160 to the thyristor 100 through the outer circuit.

In the embodiment shown in FIG. 1B, according to the structure of the circuit, the thyristor 100 is the combination of two thyristors essentially. Specifically, in the condition that the doping type of the first doping regions 120 is P-type, and the doping type of the second doping regions 130, the third doping regions 140, and the base region 110 are N-type, the light doping regions 124 and the partial adjacent heavy doping regions 122 might be the anode diffusion region. The third doping regions 140 might be the cathode diffusion region, and other part of the heavy doping regions 122 which are the short circuit region 170 might be act as the cathode short hole.

Based on the above-mentioned, according to the common knowledge of the P-N junction in the technology of the semiconductor device, it can be known that the voltage surges might pass through the thyristor 100, and each metal layer 160 might be taken as the anode or the cathode. Therefore, each metal layer 160 of the thyristor 100 might be taken as the input or output terminal of the voltage, and those metal layers 160 might electrically connect with the power terminal and the ground terminal.

When the metal layer 160 which near the first side 112 (which is the metal layer 160 on the top in FIG. 1B) is taken as the anode, and the metal layer 160 near the first side 114 (which is the metal layer 160 on the bottom in FIG. 1B) is taken as the cathode, the voltage surges coming from the power terminal might enter the thyristor 100 from the metal layer 160 near the first side 112, and the voltage surges pass through the first doping regions 120 and the base region 110 located on the first side 112 consequently. After that, the voltage surges from the second side 114 of the base region 110 might pass through the second doping regions 130, the first doping regions 120, the third doping regions 140, and the metal layer 160 sequentially, and then leave the thyristor 100 to transmit to the ground terminal.

Otherwise, when the metal layer 160 near the first side 112 (which is the metal layer 160 on the top in FIG. 1B) is taken as the cathode, and the metal layer 160 near the first side 114 (which is the metal layer 160 on the bottom in FIG. 1B) is taken as the anode, the voltage surges coming from the power terminal might enter the thyristor 100 from the metal layer 160 near first side 114, and the voltage surges pass through the first doping regions 120 and the base region 110 located on the first side 114 consequently. After that, the voltage surges from the second side 112 of the base region 110, might pass through the second doping regions 130, the first doping regions 120, the third doping regions 140, and the metal layer 160 sequentially, and then leave the thyristor 100 to transmit to the ground terminal.

It can be known from the preceding paragraph that the thyristor 100 in this embodiment might transmit and guide the voltage surges to the ground terminal, so as to prevent the circuit from damaging by the voltage surges. Furthermore, since the thyristor 100 is the combination of two thyristors, each metal layer 160 might be the input or output terminal of the voltage.

It is worth noting that the number of the second doping regions 130 is two, and the number of the third doping regions 140 is two in this embodiment. Nevertheless, the number of both the second doping regions 130 and the third doping regions 140 each might be one in other embodiment, so as to make the thyristor 100 with the function of just one thyristor. That is say, one of the metal layers 160 only is taken as the anode, and the other metal layer 160 only is taken as the cathode. Therefore, the numbers of second doping region 130 and third doping region 140 shown in FIG. 1B are just the examples of this embodiment and not used to restrict the present invention.

In addition, since the thyristor 100 includes the second doping regions 130 in contact with both the base region 110 and the heavy doping regions 122, and the doping type of the heavy doping regions 122 is different from the doping type of the second doping regions 130, the inner electric field with sufficient strength might be generated between the heavy doping regions 122 and the second doping regions 130, so as to reduce the breakdown voltage of the thyristor 100. Comparing to the thyristor of the conventional technology, the second doping regions 130 may be utilized to reduce the breakdown voltage of the thyristor 100 in this embodiment.

Moreover, in the present invention, these second doping regions 130 are partially exposed by the concave side surfaces 116a, 116b respectively, so as to make the second doping regions 130 close to the edge of the base region 110 and the first doping regions 120. According to the general knowledge of the electromagnetics, the charge density is generally higher in the edge of the object. Therefore, those second doping regions 130 might generate the inner electric field with sufficient strength and do not occupy too large space inside the thyristor 100, so as to reduce the breakdown voltage of the thyristor 100 effectively.

In addition, nowadays, the communication devices, like unsymmetrical digital subscriber lines, routers, and digital set-top boxes, have higher sensitivity of the voltage, and the electric signals transmitted inside the communication devices might have distortions by the influence of the capacitance. Therefore, in the application of the thyristor of those communication devices, it is necessary to control the capacitance between the anode and cathode.

The above-mentioned capacitance is always determined according to the doping concentration of the base region. The higher doping concentration of the base region is, the higher the capacitance is. On the other hand, the lower doping concentration of the base region is, the lower the capacitance is. However, in order to reduce the breakdown voltage, the base region of the thyristor which is utilized in the conventional application of the above-mentioned communication devices with higher doping concentration result in higher capacitance.

Consequently, since the second doping regions 130 of the thyristor 100 are utilized to reduce the breakdown voltage, and the capacitance of the thyristor 100 between these metal layers 160 is determined by the doping concentration of the base region 110, in this embodiment, the breakdown voltage of the thyristor 100 would not be influenced in general, even reduce the doping concentration of the base region 110. Therefore, the reduction of the doping concentration of the base region 110 can reduce the capacitance between these metal layers 160. For instance, the capacitance of the thyristor 100 between these metal layers 160 might be between 15 picofarad (pF) and 30 picofarad (pF). Also, the reduction of the doping concentration of the doping concentration of the base region 110 can make the thyristor 100 keep lower breakdown voltage.

It's worth noting that the thyristor 100 might further comprises a pair of the insulating layers 150 which located on the concave side surfaces 116a, 116b respectively and cover these concave side surface 116a, 116b, so that these insulating layers 150 are in contact with the base region 110. Moreover, these insulating layers 150 might be further in contact with the heavy doping regions 122 and the second doping regions 130 of the first doping regions 120, shown as FIG. 1B.

Figure 2:
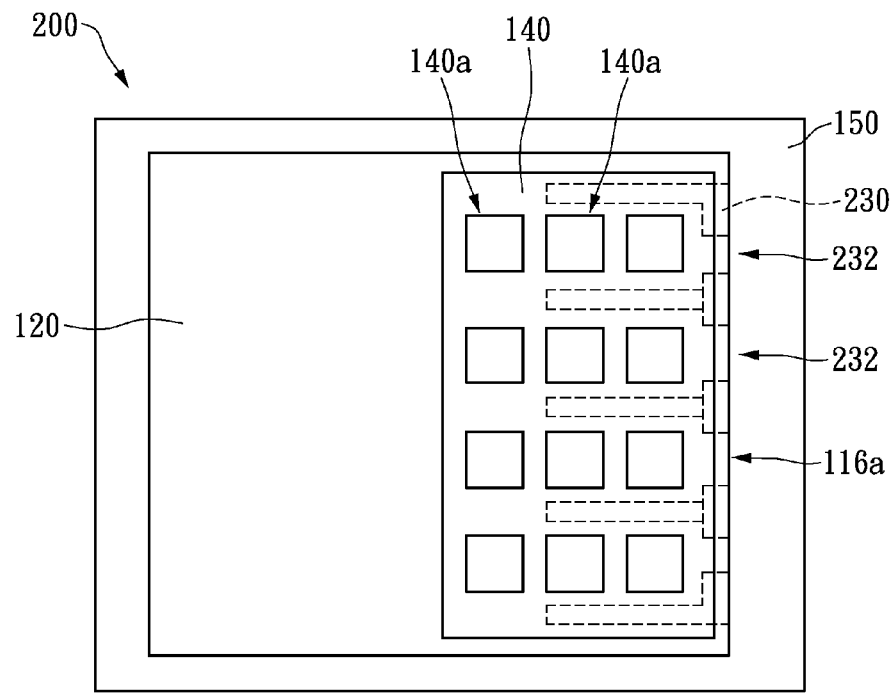
FIG. 2 is a plan view of the thyristor in the second embodiment of the present invention.

FIG. 2 is the plan view of the thyristor in the second embodiment of the present invention. Referring to FIG. 2, the thyristor 200 in this embodiment is similar to the thyristor 100 in the first embodiment. For example, both the thyristor 100 and 200 have the same function, include some of the same elements, and have the same cross-section structure as shown in FIG. 1B. Nevertheless, the difference between the thyristor 100 and 200 is that the second doping regions 230 in the thyristor 200 are different from the second doping regions 130 in the thyristor 100. The difference would be introduced in the following paragraph.

Specifically, there is a plurality of intervals 232 in the second doping regions 230, and the intervals 232 are arranged along the concave side surface 116a. Each of the intervals 232 and the mesh spaces 140a of the third doping regions 140 are arranged in a line, shown in FIG. 2. Besides, comparing with FIG. 1A and FIG. 2, it can be known that the extending distance of the second doping region 130 from the concave side surface 116a is about the lengthen of one mesh space 140a, and the extending distance of the second doping region 230 from concave side surface 116a is about the lengthen of two mesh spaces 140a. Therefore, the extending distance of the second doping region 230 from the concave side surface 116a might be different from the extending distance of the second doping region 130.

Nonetheless, it's necessary to mention that the extending distance of the second doping region 130 from the concave side surface 116a in FIG. 1A might be more than the lengthen of one mesh space 140a, and the extending distance of the second doping region 230 from the concave side surface 116a in FIG. 2 might be more than the lengthen of one mesh space 140a or two mesh spaces 140a. Therefore, both of the second doping regions 130 in FIG. 1A and the second doping regions 230 in FIG. 2 are only the examples and are not used to restrict the present invention.

The above-mentioned description just describes the structure of the thyristor according to one of the embodiments in the present invention. The following description will describe the manufacturing method of the thyristor cooperated with FIG. 3A to FIG. 3F. It's necessary to mention that the manufacturing method of the thyristor 100 is the same as the manufacturing method of the thyristor 200, and thus, the thyristor 100 is taken as an example to illustrate specifically.

Figure 3A:
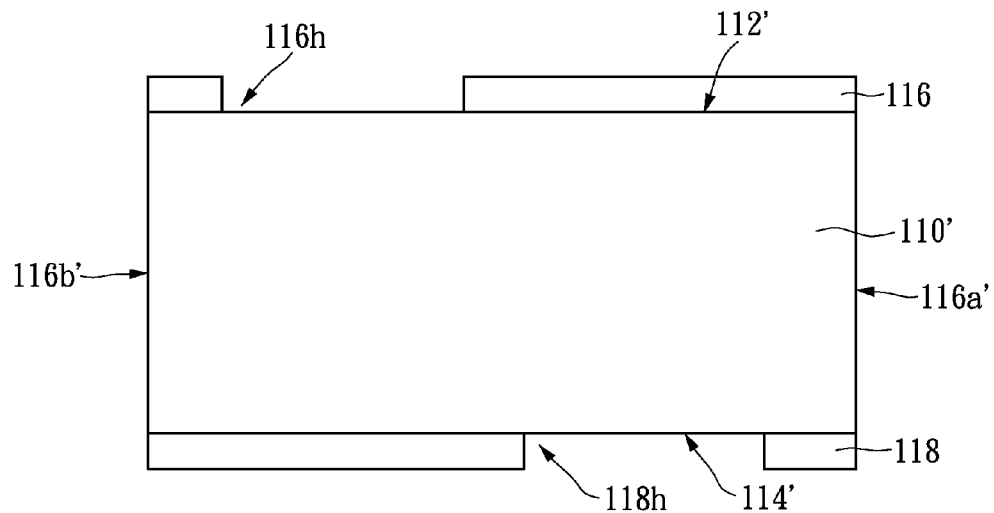
FIG. 3A to FIG. 3F illustrate of the manufacturing method of the thyristor in the first embodiment of the present invention.

FIG. 3A to FIG. 3F are the procedure cross-section view of the manufacturing method of the thyristor in FIG. 1B. Referring to FIG. 3A, first, a substrate 110' with the first doping type is provided. The substrate 110' has a first surface 112', a second surface 114' opposite to the first surface 112', and a pair of the side surfaces 116a', 116b'. Those side surfaces 116a', 116b' are located between the second surfaces 114' of the first surface 112'. Furthermore, the substrate 110' is made of the silicon or other semiconductor material, and the first doping type might be N-type or P-type.

Next, a pair of first shielding layers 116 and 118 is formed on the first surface 112' and the second surface 114' of the substrate 110' respectively. The first shielding layer 116 has a first opening 116*h*, and the first shielding layer 118 has a first opening 118*h*. The first shielding layers 116 and 118 are formed via thermal oxidation and deposition. The thermal oxidation means heating the substrate 110', thereby oxidizing the substrate 110'. Thus, the oxidative layer is formed. Since the substrate 110' might be made of the silicon, the first shielding layers 116 and 118 might be the $SiO_2$ layers via the thermal oxidation. In addition, the first openings 116*h* and 118*h* might be formed via photolithography and etching. Moreover, the etching method might be wet etching or dry etching.

Figure 3B:
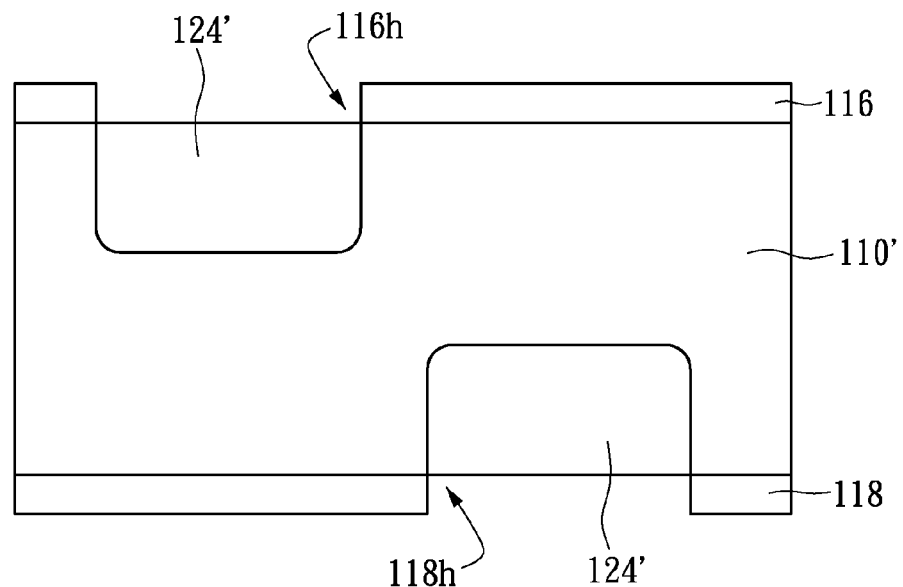

Referring to FIG. 3B, next, the substrate 110' located in the first openings 116*h*, 118*h* is doped with the second doping type dopants to form two light doping regions 124', so as to make two light doping regions 124' with the second doping type. The second doping type might be N-type or P-type, but different from the first doping type. For example, while the second doping type is N-type, the first doping type is P-type. In contrast, while the second doping type is P-type, the first doping type is N-type.

The method of doping with the second doping type dopants is ion implant or thermal drive-in. While using the thermal drive-in for doping with the second doping type dopants, first, the doping material such as Phosphorus or Boron is formed on the substrate 110' and is exposed on the first openings 116*h* and 118*h*. After that, the doping material is heated to diffuse into the substrate 110', so as to form these light doping regions 124.

Figure 3C:
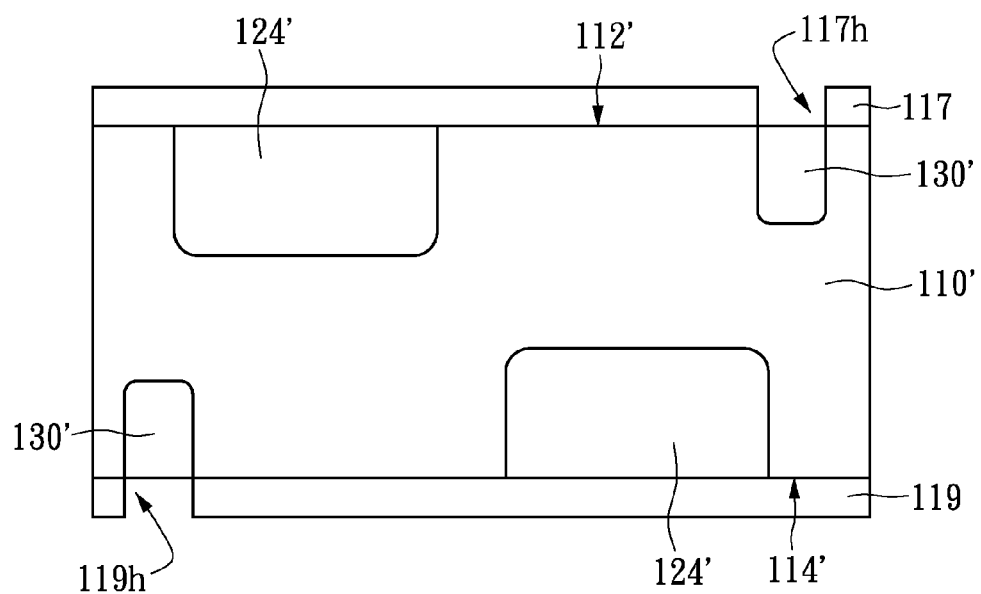

Referring to FIG. 3B and FIG. 3C, next, the first shielding layers 116, 118 are removed by the etchant or plasma, and the etchant is such as Hydrofluoric acid (HF). Then, a pair of second shielding layers 117, 119 is formed on the first surface 112' and second surface 114' respectively. These second shielding layers 117, 119 cover the light doping regions 124' entirely, and have the second openings 117*h*, 119*h*. The method to form the second shielding layers 117, 119 might be the same as the method to form the first shielding layers 116, 118, and thus, the method to form the shielding layers 117, 119 is not described again.

After forming the second shielding layers 117, 119, the substrate 110' exposed by these second openings 117*h* and 119*h* are doped with the first doping type via ion implant or thermal drive-in to form two second doping regions 130' with the first doping type.

Figure 3D:
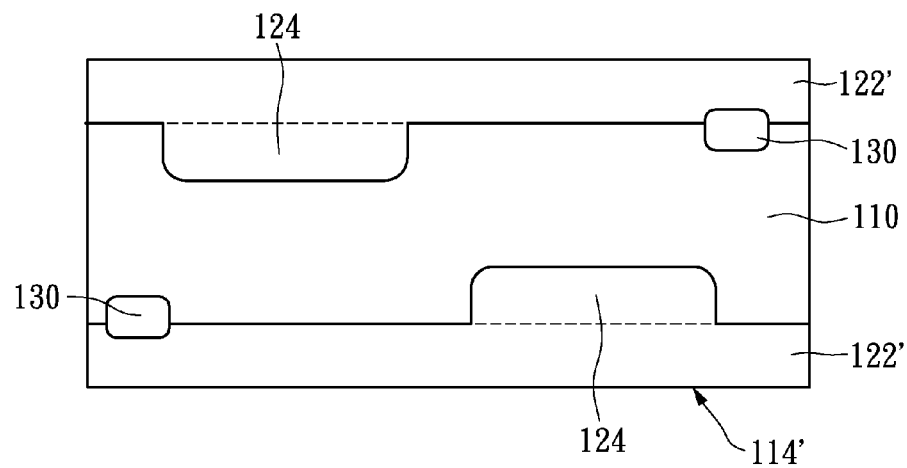

Referring to FIG. 3C and FIG. 3D, then, the second shielding layers 117, 119 are removed to expose the first surface 112' and the second surface 114' of the substrate 110'. The method to remove the second shielding layers 117, 119 might be the same as the method to remove the first shielding layers 116, 118. That is, the second shielding layers 117, 119 might be removed by the etchant (such as HF) or plasma.

Then, the first surface 112' and the second surface 114' are doped with the second doping type dopants to form a pair of heavy doping regions 122' in contact with the second doping regions 130' in the first surface 112' and the second surface 114' respectively. The doping concentration of the heavy doping regions 122' is higher than the doping concentration of the light doping regions 124'. Besides, the heavy doping region 122' is doped via ion implant or thermal drive-in. After forming the heavy doping regions 122', the base region 110, the light doping regions 124, and the second doping regions 130 of the thyristor 100 is formed.

Figure 3E:
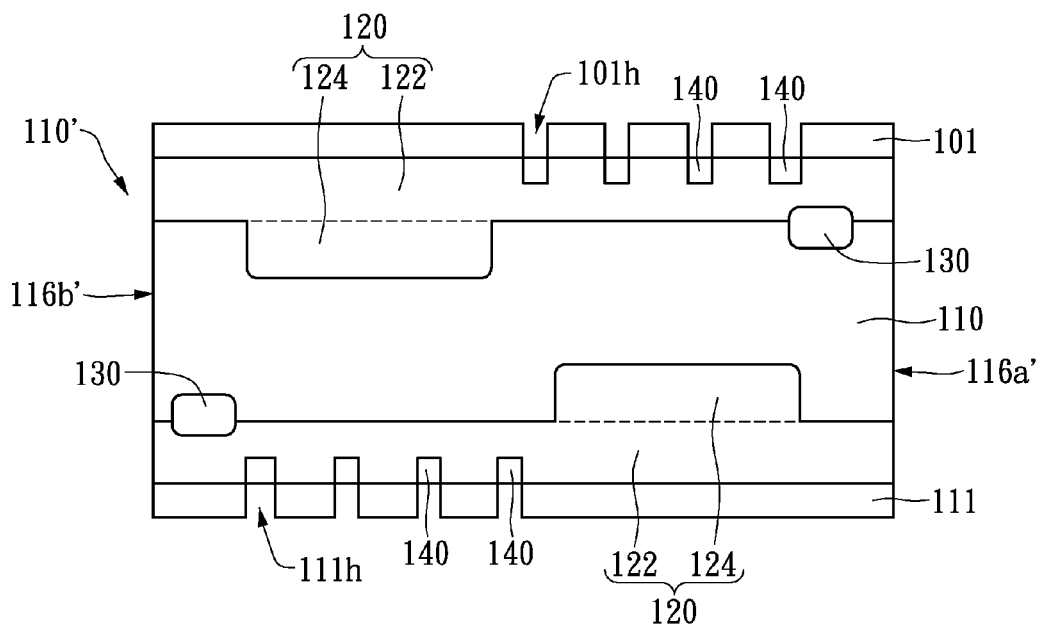

Referring to FIG. 3D and FIG. 3E, next, a pair of third shielding layers 101, 111 is formed on these heavy doping regions 122' respectively. These third shielding layers 101, 111 respectively have the openings 101*h* and 111*h* for doping with the first doping type dopants in the following process.

The opening 101*h* is in the shape of a mesh as well as the opening 111*h*. In addition, the method of forming these third shielding layers 101, 111 and the openings 101*h*, 111*h* might be the same as the method of forming the first shielding layers 116, 118 and openings 116*h*, 118*h*, and thus, the method is not described again.

After forming the third shielding layers 101, 111, the heavy doping regions 122' located on these openings 111*h* and 101*h* are doped with the first doping type dopants to form these third doping regions 140. The third doping region 140 is in the shape of a mesh. The third doping regions 140 may be formed via ion implant or thermal drive-in. At that time, the heavy doping regions 122 shown in FIG. 1B are formed, which means that the first doping regions 120 of the thyristor 100 are formed.

Figure 3F:
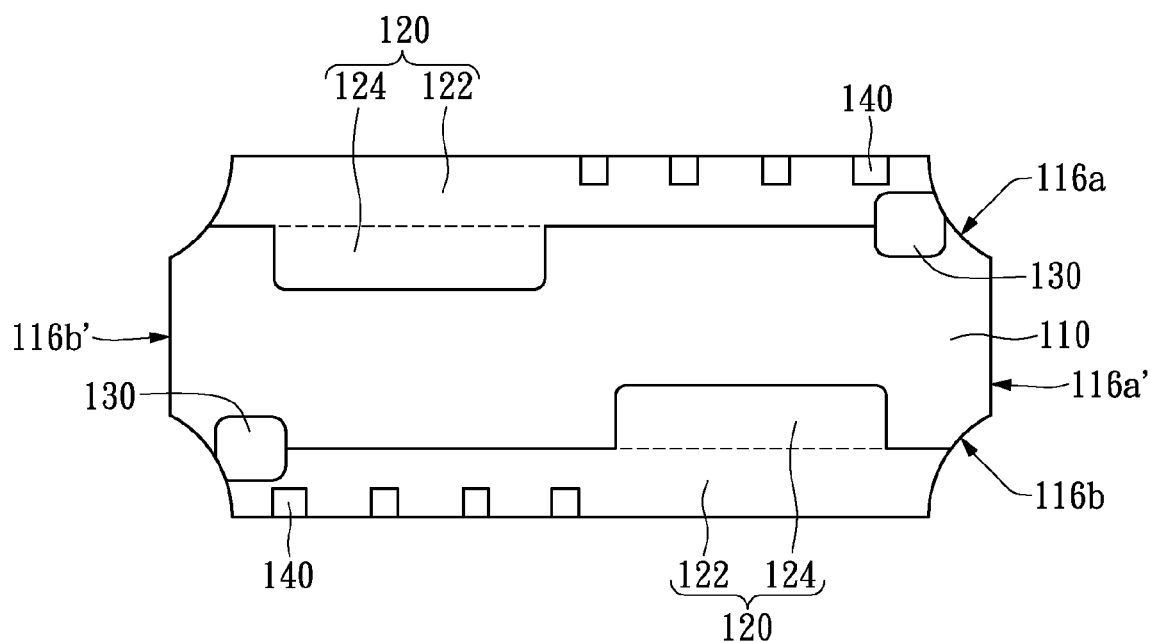

Referring to FIG. 3E and FIG. 3F, then, the third shielding layers 101, 111 are removed to expose these first doping regions 120, and the method of removing the third shielding layers 101, 111 might be the same as the method of removing the second shielding layers 117, 119. Next, the side surfaces 116*a'*, 116*b'* of the substrate 110' are etched partially to form the concavities in these side surfaces 116*a'*, 116*b'* respectively. The concavities are the concave side surfaces 116*a*, 116*b* shown in FIG. 1B.

Continued from the preceding paragraph, after the third shielding layers 101, 111 are removed, and the concave side surfaces 116*a*, 116*b* are formed, two metal layers 160 are formed on these first doping regions 120 respectively, and these insulating layers 150 are formed via spin-coating on the concave side surfaces 116*a*, 116*b*, shown as FIG. 1B. The materials employed by the above-mentioned spin-coating on the concave side surfaces 116*a*, 116*b* might be the metal oxide with silicon, such as the aluminium oxide with silicon. The metal layers 160 are formed via sputter or evaporation. The thyristor 100 (referring to FIG. 1B) is complete basically so far.

It worth noting that in the circuit structure, the thyristor 100 shown in FIG. 1B is the combination of two thyristors essentially. Nevertheless, in the other embodiment, the number of the second doping regions 130 as well as the third doping regions 140 might be only one, so as to make the thyristor 100 with the function of only one thyristor. Therefore, based on the different circuit structure of the thyristor 100, the above-mentioned manufacturing method shown in FIG. 3A to FIG. 3F might be form only one second doping region 130 and only one third doping region 140. It is not necessary to form two second doping regions 130 and two third doping regions 140.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:
1. A thyristor, comprising:
a base region, with a first side and a second side opposite to the first side;
a pair of first doping regions, formed on the first side and the second side respectively, and in contact with the base region;
at least a second doping region, formed between one of the first doping regions and the base region, wherein the second doping region is in contact with the base region and the first doping region;

at least a third doping region, formed inside one of the first doping regions, and in contact with the first doping region, wherein the third doping region is not in contact with the base region, wherein the doping type of the first doping regions is different from the doping type of the second doping region, the third doping region, and the base region, wherein the third doping region is in the shape of a mesh and has a plurality of mesh spaces arranged in an array, and the second doping region doesn't overlap the mesh spaces; and a pair of metal layers, in contact with the first doping regions respectively, wherein the first doping regions and the third doping region are all located between the metal layers, and one of the metal layers is further in contact with the third doping region, but not in contact with the second doping region.

2. The thyristor of claim 1, wherein the doping concentration of the second doping region is higher than the doping concentration of the base region, and lower than the doping concentration of the third doping region.

3. The thyristor of claim 1, wherein an entire doping concentration of the thyristor is between 1E13 ion/$cm^2$ and 1E15 ion/$cm^2$, and a capacitance of the thyristor between the metal layers is between 15 picofarad and 30 picofarad.

4. The thyristor of claim 1, wherein the base region has a pair of concave side surface, and one of the concave side surfaces surrounds and connects to the first side, another concave side surface surrounds and connects to the second side, and the second doping region partially exposed to one of the concave side surfaces.

5. The thyristor of claim 4, further comprising a pair of insulating layers located on the concave side surface respectively.

6. The thyristor of claim 1, wherein the second doping region has a plurality of intervals arranged along the concave side surface, and each of the intervals and the mesh spaces are arranged in a line.

7. The thyristor of claim 1, wherein at least one of the first doping regions comprising:
a heavy doping region, in contact with the base region; and
a light doping region, located between the heavy doping region and the base region, and in contact with the heavy doping region and the base region.

8. The thyristor of claim 1, wherein the number of the second doping regions is two, the number of the third doping regions is two, and the third doping regions formed inside the first doping regions respectively are in contact with the first doping regions and not in contact with the base regions, wherein each of the second doping regions is formed between one of the first doping regions and the base region, and is in contact with the base region and the first doping region.

9. A thyristor, comprising:
a base region, with a first side and a second side opposite to the first side, wherein the base region has a pair of concave side surface, and one of the concave side surfaces surrounds and connects to the first side, another concave side surface surrounds and connects to the second side;

a pair of first doping regions, formed on the first side and the second side respectively, and in contact with the base region;

at least a second doping region, formed between one of the first doping regions and the base region, wherein the second doping region is partially exposed on one of the concave side surfaces and in contact with the base region and the first doping region;

at least a third doping region, formed inside one of the first doping regions, and in contact with the first doping region, wherein the third doping region is not in contact with the base region, wherein the doping type of the first doping regions is different from the doping type of the second doping region, the third doping region, and the base region;

wherein the third doping region is in the shape of a mesh and has a plurality of mesh spaces arranged in an array, and the second doping region is in the shape of a comb without overlapping the mesh spaces, and extends from the concave side surface to a region between two of the adjacent mesh spaces; and a pair of metal layers, in contact with the first doping regions respectively, wherein the first doping regions and the third doping region are all located between the metal layers, and one of the metal layers is further in contact with the third doping region, but not in contact with the second doping region.

10. A thyristor, comprising:
a base region, with a first side and a second side opposite to the first side;

a pair of first doping regions, formed on the first side and the second side respectively, and in contact with the base region;

a pair of second doping regions, wherein each of the second doping regions is formed between one of the first doping regions and the base region, and is in contact with the base region and the first doping region;

a pair of third doping regions, formed inside the first doping regions respectively, and in contact with the first doping regions, wherein the third doping regions are not in contact with the base region, wherein the doping type of the first doping regions is different from the doping type of the second doping region, the third doping region, and the base region; and a pair of metal layers, in contact with the first doping regions respectively, wherein the first doping regions and the third doping region are all located between the metal layers, and one of the metal layers is further in contact with the third doping region, but not in contact with the second doping region.

\* \* \* \* \*